United States Patent [19]

Kitamura

[11] Patent Number: 5,581,512
[45] Date of Patent: Dec. 3, 1996

[54] SYNCHRONIZED SEMICONDUCTOR MEMORY

[75] Inventor: Mamoru Kitamura, Tokyo, Japan

[73] Assignee: NEC Corporation, Japan

[21] Appl. No.: 537,461

[22] Filed: Oct. 2, 1995

[30] Foreign Application Priority Data

Sep. 30, 1994 [JP] Japan ................... 6-236528

[51] Int. Cl.⁶ .................................. G11C 11/407
[52] U.S. Cl. ............... 365/233; 365/189.01; 365/230.01; 365/189.08
[58] Field of Search ................. 365/233, 233.5, 365/189.01, 230.01, 189.08

[56] References Cited

U.S. PATENT DOCUMENTS

| 4,970,693 | 11/1990 | Nozaki et al. | 365/233 |
| 5,335,206 | 8/1994 | Kawamoto | 365/233 |
| 5,414,672 | 5/1995 | Ozeki et al. | 365/233 |
| 5,475,646 | 12/1995 | Ogihara | 365/233 |

Primary Examiner—Tan T. Nguyen
Attorney, Agent, or Firm—Ostrolenk, Faber, Gerb & Soffen, LLP

[57] ABSTRACT

A synchronized semiconductor memory device comprising a memory cell array, an address input circuit, an address set circuit, a command input circuit, a data reading/writing control circuit, a data output circuit, a data input circuit, a clock input circuit, an internal clock generating circuit, an internal clock timing control circuit. The clock input circuit comprises first and second clock input circuits, and the internal clock generating circuit comprises a first internal clock generating circuit receiving a clock information from the first clock input circuit, for generating a fist reference internal clock signal controlling the address input circuit, the address set circuit, the command input circuit, the data reading/writing control circuit, the data output circuit and the data input circuit, and a second internal clock generating circuit receiving a clock information from the second clock input circuit, for generating a second reference internal clock signal controlling only the data output circuit.

2 Claims, 6 Drawing Sheets

SYNCHRONIZED SEMICONDUCTOR MEMORY

BACKGROUND OF THE INVENTION

1. Field of the Invention

The present invention relates to a synchronized semiconductor memory.

2. Description of Related Art

Synchronized semiconductor memory devices using dynamic random access memories (DRAM) have been variously designed to operate with a high speed, but in the prior art DRAM, there is a problem that an access time of the DRAM interferes with elevation of the system capacity in a high speed system such as a RISC (reduced instruction set computer) type MPU (microprocessor unit) whose system clock frequency exceeds 100 MHz (10 ns). In order to solve this problem, a semiconductor memory device synchronized with an external clock has been proposed. There are many techniques to realize this synchronized semiconductor memory device. One of these techniques is so called three-stage pipeline. This is such technique as to realize a high speed operation by dividing a reading/writing operation starting a column address receiving, with two latch circuits, into three parts which operate in parallel to one another.

Figure 1:
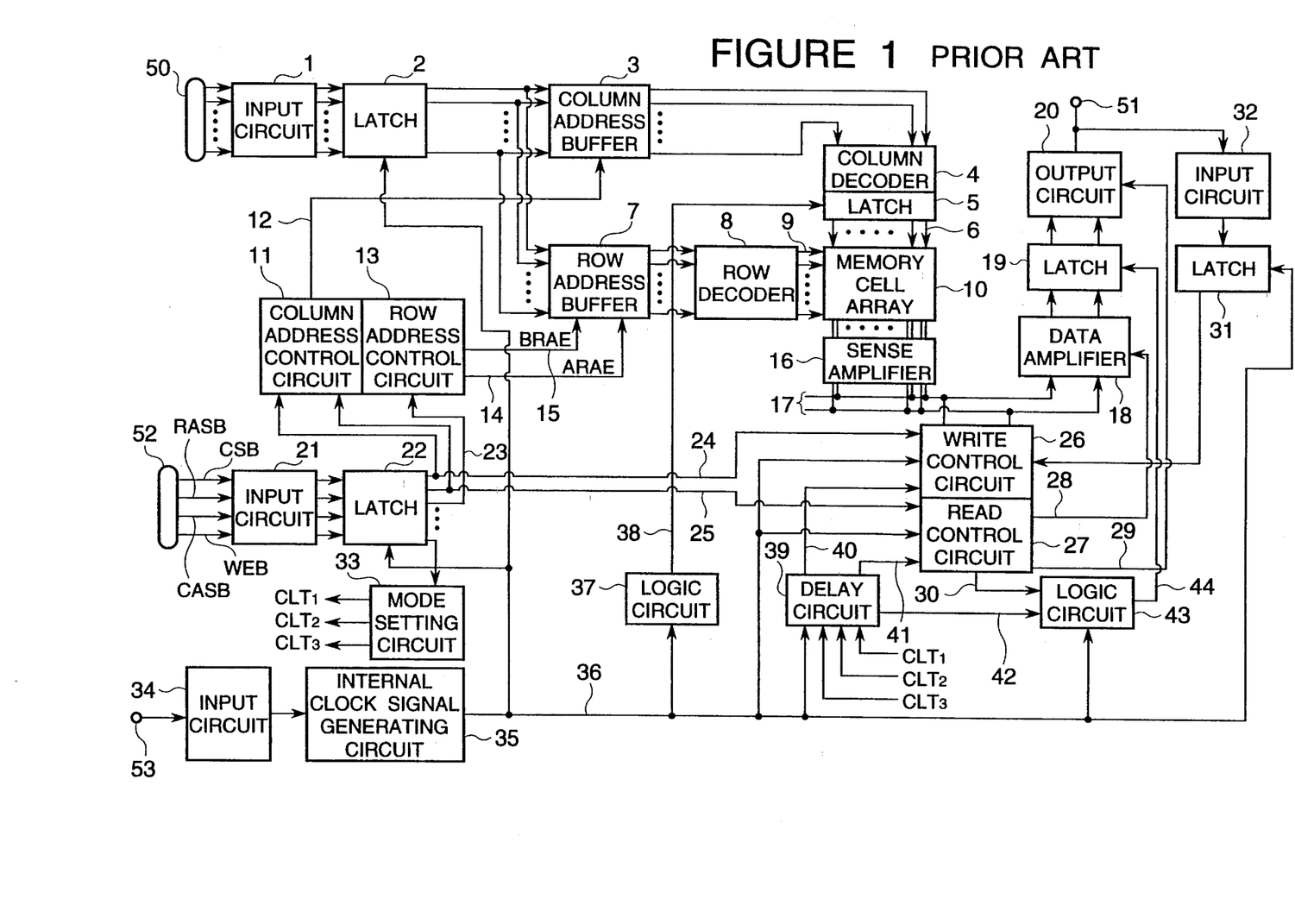
FIG. 1 is a block diagram illustrating a construction of the prior art synchronized semiconductor memory device.

Now, the prior art synchronized semiconductor memory device will be explained with reference to FIGS. 1 to 3. FIG. 1 is a block diagram illustrating a construction of the prior art synchronized semiconductor memory device, and FIGS. 2 and 3 are timing charts illustrating an operation of the prior art synchronized semiconductor memory device.

In the following explanation, the negation of a chip selection signal CS, a row address strobe signal RAS, a column address strobe signal CAS and a write enable signal WE are indicated as CSB, RASB, CASB and WEB, respectively.

Figure 2:
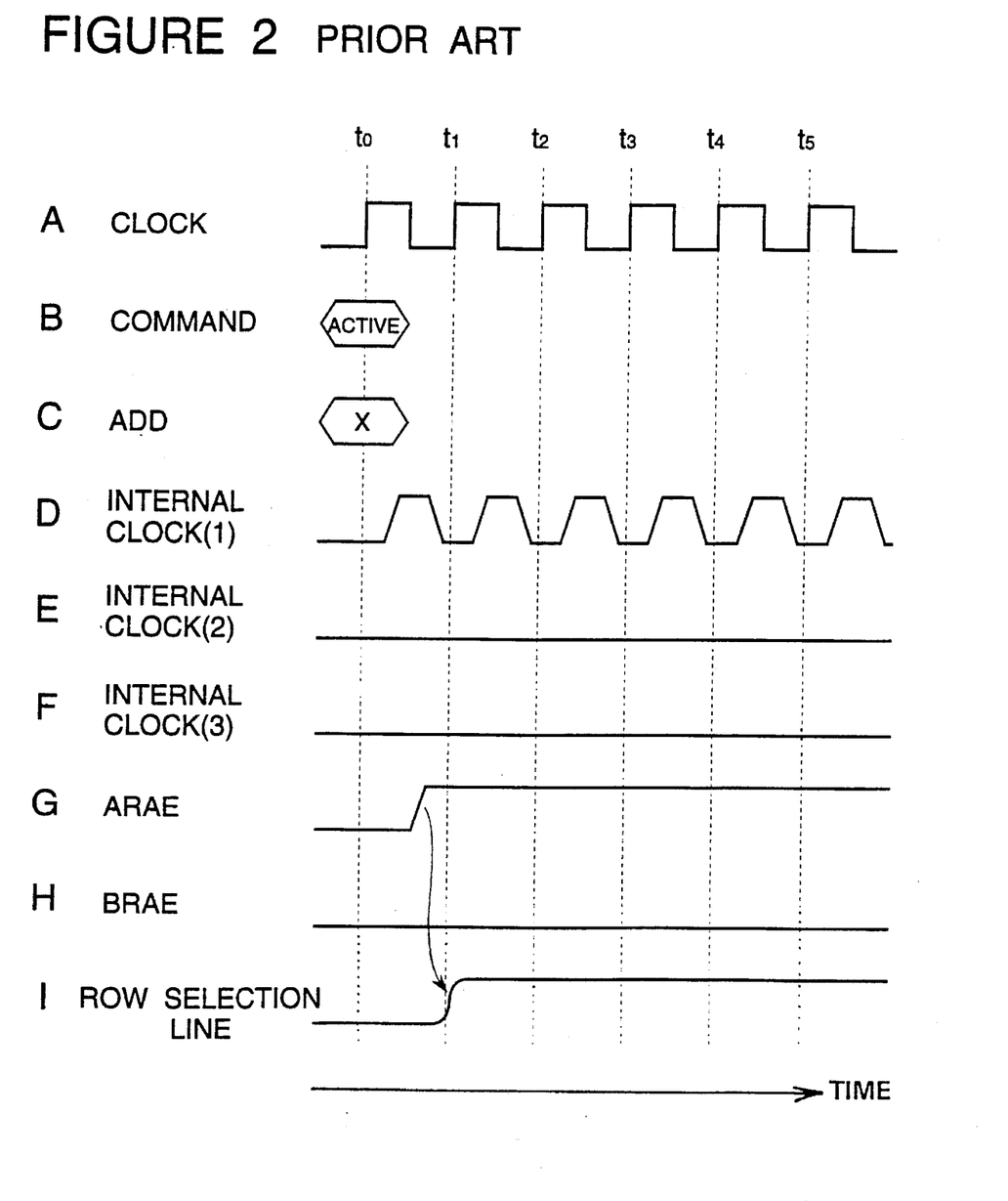
FIGS. 2 and 3 are timing charts illustrating an operation of the prior art synchronized semiconductor memory device shown in FIG. 1.
Figure 3:
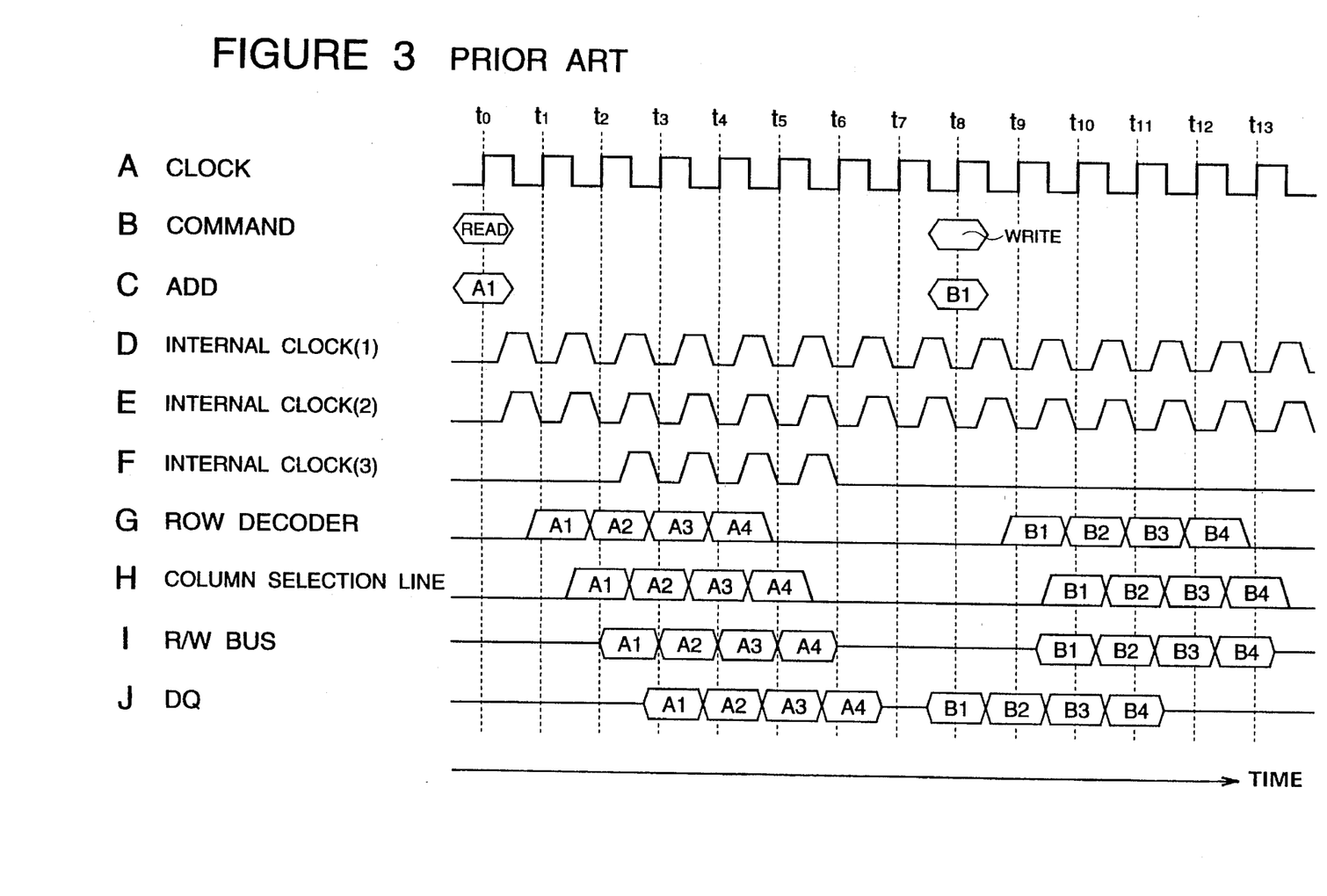

Referring to FIGS. 1 and 2, at a time to an ACTIVE command (in a row address operation command, both of the signals CSB and RASB are at a LOW level, and both of the signals CASB and WE are at a HIGH level) is inputted into input terminals 52. The command is decoded by an input circuit 21, and then latched in circuit (D flip-flop circuit) 22. Furthermore, at the time t0, a clock is inputted from a terminal 53 through an input circuit 34 to an internal clock generating circuit 35.

In the internal clock generating circuit 35, an internal clock signal (1) 36 is generated, and supplied to latch circuits 2, 22 and 31, logic circuits 37 and 43, a writing control circuit 26, a read control circuit 27, and a delay circuit 39. The logic circuit 37 receives the internal clock signal (1) 36 and generates an internal clock signal (2) 38. Furthermore, the delay circuit 39 receives the internal clock signal (1) 36 and other input signals, and generates an internal clock signal (5) 40, an internal clock signal (6) 41, and an internal clock signal (7) 42. Similarly, the logic circuit 43 receives the internal clock signal (1) 36, the internal clock signal (7) 42 supplied from the delay circuit 39, an internal clock signal (3) enable signal 30 outputted from the reading control circuit 27, and generates an internal clock signal (3) 44.

The ACTIVE command as mentioned above is latched in the latch circuit in response to the internal clock signal (1) 36, and the latched active command is supplied to an row address control circuit 13, which in turn generates an "A bank" row address enable signal ARAE 14 and, a "B bank" row address enable signal BRAE 15. And further, a row address ADD(X) inputted into terminals 50 is supplied through an input circuit 1 to the latch circuit (D flip-flop circuit) 2, and then latched in the latch circuit 2 in response to the internal clock signal (1) 36. Thereafter, the latched row address ADD(X) is inputted through a row address buffer 7 into a row decoder 8, which in turn selects a row selection line 9 corresponding to the row address ADD(X).

The synchronized semiconductor memory device shown FIG. 1 is an example of a two-bank constitution. Here, the bank is that a selection and a precharge of a row address can be independently executed in each bank, and the synchronized semiconductor memory containing the two banks has two sets of row address control circuit. As mentioned above, ARAE shown in FIG. 2 is a row address enable signal for the A bank, and BRAE is a row address enable signal for the B bank. When the ACTIVE command signal is inputted, the signals ARAE and BRAE are brought to a HIGH level. The time chart shown in FIG. 2 shows an example in which the A bank is selected and therefore the signal ARAE is at the HIGH level.

Now, a data reading operation will be explained. Referring to FIGS. 1 and 3, at the time t0, the READ command (the reading operation command: both of the signals CSB and CASB are at a LOW level, both of the signals RASB and WEB is at a HIGH level) is inputted, and the address ADD(A1) is inputted to the terminals 50. Therefore, the READ command is decoded in the input circuit 21 and supplied into the latch circuit 22. The READ command is latched in the latch circuit 22 in response to the internal clock signal (1) 36, and the latched READ command signal 25 is inputted into a column address control circuit 11, and also sent to a read control circuit 27.

The column address control circuit 11 receives the latched READ command signal 25, and generates the column address enable signal 12 to a row address buffer 3. And then, the address ADD(1) is inputted into the latch circuit 2 through the input circuit 1, and latched in response to the internal clock signal (1) 36. The latched address ADDA(1) is inputted into a column decoder 4 through a column address buffer 3. The address ADD(A1) outputted from the column decoder 4 is latched in a latch circuit (D type latch) 5 in response to the internal clock signal (2) 38 outputted from the logic circuit 37, so that a column selection line 6 corresponding to the given address is selected. Thus, memory cells to be read are selected.

Next, the output data read from a memory cell array 10 through sense amplifier 16 is supplied through a R/W (READ/WRITE) bus 17 and amplified by a data amplifier 18, and then, latched in a latch circuit (D type flip-flop circuit) 19 in response to the internal clock signal (3) 44 corresponding to the clock at a time $t_2$, and outputted to a terminal 51 through an output circuit 20. FIG. 3 shows a time chart in the case of a burst length (bit length to be read and written at the same time) of 4 bits. In FIG. 3, in a series of operation, the operation for the following bits is executed in each one cycle, and these operations are processed in parallel to one another. Namely, the second bit (A2) is executed with three clocks of $t_1$~$t_3$, the third bit (A3) is executed with three clocks of t2~t4, and the forth bit (A4) is executed with three clocks of t3~t5.

Next, a data writing operation will be explained. This operation is almost the same with the reading operation as mentioned above. Referring to FIG. 3, at a time $t_8$, a WRITE command (writing operation command: the signals CSB, CASB and WEB are at a LOW level, and the signal RASB is at a HIGH level) is inputted from the terminal 52, and a writing data (DQ) is inputted from the terminal 51. In addition, an address ADD(B1) is inputted from the terminal 50.

The WRITE command is decoded by the input circuit 21, and supplied to the latch circuit 22. In the latch circuit 22, the WRITE command is latched in response to the internal clock signal (1) 36 outputted from the internal clock signal generating circuit 35 corresponding to the clock of the time $t_8$, and a WRITE command signal 24 is outputted from the latch circuit 22, and sent to a writing control circuit 26. The writing data (DQ) inputted from the terminal 51 is sent into a latch circuit (D type flip-flop) 31 through an input circuit 32, and then, is latched in response to the internal clock signal (1) 36 outputted from the internal clock signal generating circuit 35 corresponding to the clock of the time t8, so that the latched data is sent into the writing control circuit 26.

On the other hand, an address ADD (B1) is inputted into the latch circuit 2 through the input circuit 1, and latched in the latch circuit 2 in response to the internal clock signal (1) 36 outputted from the internal clock signal generating circuit 35 corresponding to the clock of the time $t_8$. The latched address ADD(B1) is inputted into the column decoder 4 through the column address buffer 3. An address ADD (B1) outputted from the column decoder 4 is latched in the latch circuit 5 in response to the internal clock signal (2) 38 outputted from the logic circuit 37 corresponding to the clock of the time $t_9$, so that a column selection line 6 corresponding to the given address ADD(B1) is selected. Thus, a memory cell to be written in the memory array 10 is selected.

At the same time, in response to the internal clock signal (1) 36 corresponding to the time 19, the write data (DQ) is outputted from the write control circuit 26 and is sent to the sense amplifier 16 through the R/W (READ/WRITE) bus 17, so that it is amplified by the sense amplifier 16, and is written onto the corresponding memory cell of memory cell array 10. And, the column selection number 9 is brought to a non-selected state in response to the internal clock signal (2) 38 corresponding to the clock of the time $t_{10}$, so that the writing operation finishes. Similarly to the reading operation, the writing operation is executed with a unit of 4 bits in parallel. Namely, the second bit (B2) is executed with three clocks of $t_9 \sim t_{11}$, the third bit (B3) is executed wit three clocks of t10~t12, and the forth bit (B4) is executed with three clocks of $t_{11} \sim t_{13}$.

The above mentioned operation mode is called "CAS LATENCY 3", because, in the reading operation, data is outputted by a third clock counted after an input of the READ command is inputted. This is set by a mode set circuit 33 when a mode register set cycle (a cycle for setting CAS LATENCY or burst length, etc.: the signals CSB, RASB CASB and WEB are at a LOW level). The operation mode includes "CAS LATENCY 2" and "CAS LATENCY 1" in addition to "CAS LATENCY 3".

In the case of the "CAS LATENCY 2" mode, the internal clock signal (2) 38 is fixed to a HIGH level in order to output the data at the timing of the second clock. Namely, the latch (D type latch circuit) 5 is controlled to allow a signal to always pass therethrough, so the latches substantially become only two. As the result, the first stage and the second stage of the pipeline operate with the first clock, and the third stage operates with the second clock.

In the case of the "CAS LATENCY 1" mode, if the latch circuit 19 is of a D type latch circuit, both of the internal clock signal (3) 38 and the internal clock signal (3) 44 may be fixed to the HIGH level, but, if the latch circuit 19 is of a D type flipflop circuit, all of the first stage, the second stage and the third stage of the pipeline can be controlled to operate continuously with only one clock, by fixing the internal clock signal (2) 38 to the HIGH level and by generating the internal clock signal (3) 44 from the internal clock signal (7) 42 by using a delay circuit 39. In cases of the "CAS LATENCT 2" and "CAS LATENCT 1", the signals from the writing control circuit 26 and the read control circuit 27 are outputted at timings different from the output timing of those signals in the operating mode "CAS LATENCT 3", and therefore, are generated by using the internal clock signal (5) 40 and the internal clock signal (6) 41 outputted from the delay circuit 39, instead of the internal clock signal (1) 36.

In conclusion, the possible minimum cycle of each operating mode in a case of a device having an address access bus of 30 ns is following.

"CAS LATENCY 3" is a cycle time of 10 ns.

"CAS LATENCY 2" is a cycle time of 15 ns.

"CAS LATENCY 1" is a cycle time of 30 ns.

In the above mentioned synchronized semiconductor memory device of the prior art, the internal clock signal (1) functioning as a reference signal for the other internal clock signals is used as a timing signals of many circuits, for example, the latch circuits for the command signal input, the address input and the data input, the writing control circuit, the read control circuit, the logic circuit and the delay circuit, etc.

Figure 4:
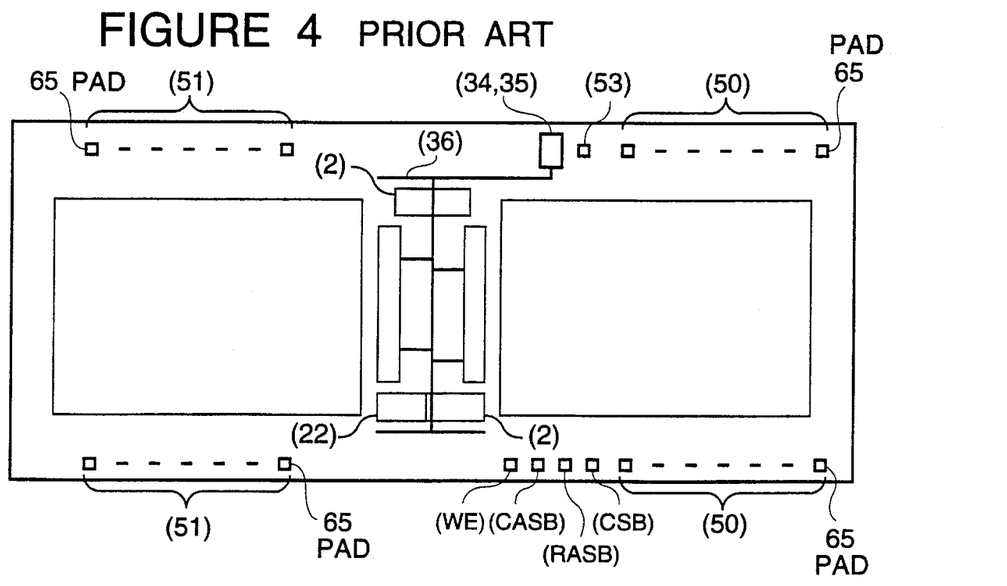
FIG. 4 illustrates the wiring of the internal clock signal in a semiconductor chip.
Figure 5:
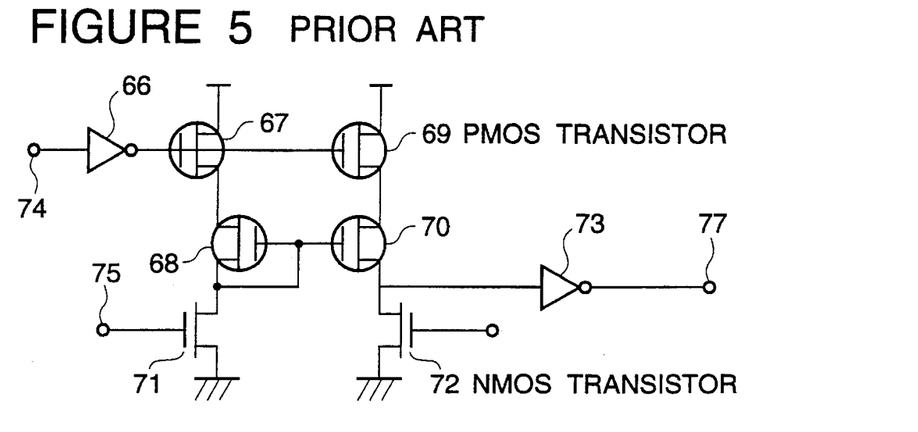
FIG. 5 is a circuit diagram showing one example of an input circuit.

As shown in FIG. 4, a semiconductor chip is required to extend a wiring, from an input circuit 34 and an internal clock signal generating circuit 35 placed in a side of a pad 65 corresponding to an external clock signal input terminal 53, to all regions including the latch circuit 22 for receiving the command supplied from both side pads, the address latch circuit 2, the control circuit, the logic circuit and the delay circuit etc., for the purpose of supplying the internal clock signal (1) 36 to all these circuits. Because of this, especially in the "CAS LATENCY 3" mode, the waveform of the internal clock signal (1) is greatly deformed under effects of a wiring capacitance and a gate load capacitance. As the result, it causes a defect of heavy delay of access time.

SUMMARY OF THE INVENTION

Accordingly, it is an object of the present invention to provide a synchronized semiconductor memory device which has overcome the above mentioned defect of the conventional one.

Another object of the present invention is to provide a synchronized semiconductor memory device capable of reducing the access time in the "CAS LATENCY 3" mode without increasing the total operating current of the device.

The above and other objects of the present invention are achieved in accordance with the present invention by a synchronized semiconductor memory device comprising:

a memory cell array constituting the dynamic random access memory;

address input means receiving an external address signal containing a row address/column address;

address set means receiving an address information from the address input means and for generating and outputting a memory selecting signal to said memory cell array;

command input means receiving an external command signal containing a row address selection control/reading control/writing control;

data reading/writing control means receiving a command information from the command input means, and for controlling a data read operation and a data writing operation to the memory cell array;

data output means controlled by the data reading/writing control means and for outputting the data read from the memory cell array;

data input means controlled by the data reading/writing control means and for receiving the data to written into said memory cell array;

clock input means receiving an external clock signal; and internal clock generating means receiving a clock information from the clock input means, and for generating a predetermined reference internal clock; and internal clock timing control means receiving the predetermined reference internal clock, and for generating a plurality of internal clock signals having different timings for the address input means, the address set means, the command input means, the data reading/writing means, the data output means and the data input means;

wherein the clock input means comprising first and the second clock input means; and wherein the internal clock generating means comprising a first internal clock generating means receiving a clock information from the first clock input means, for generating a fist reference internal clock signal controlling the address input means, the address set means, the command input means, the data reading/writing control means, the data output means and the data input means, a second internal clock generating means receiving the clock information through the second clock input means, for generating a second reference internal clock signal controlling only the data output means, and a logic circuit means receiving the first reference internal clock signal outputted from the first internal clock generate means, a specific internal clock enable signal outputted from the data reading/writing control means, a read command signal outputted from the command input means and a level signal set in accordance with a given mode register cycle, the logic circuit means generating a power supply signal for controlling the supply or no supply of power to the second clock input means.

In a preferred embodiment, the logic circuit means includes a first flip-flop circuit having a first input receiving the specific internal clock enable signal and a second input receiving the first reference internal clock signal, three cascaded inverters connected in such a manner that an input of the first inverter of the three cascaded inverters is connected to an output of the first flip-flop circuit, a NOR circuit having a first input terminal connected to the output terminal of the first flip-flop and a second input terminal connected to an output terminal of a third inverter of the three cascaded inverters, a second flip-flop circuit having a first input terminal receiving the reading command signal outputted from the command input means and a second terminal connected to an output of the NOR circuit, and an AND circuit having an input terminal concocted to a mode setting level signal set in accordance with the given mode register cycle and an second input terminal connected to an output terminal of the second flip-flop circuit, an output terminal of the AND circuit being connected to a signal line transmitting the power supply signal.

The above and other objects, features, and advantages of the present invention will be apparent from the following description of preferred embodiments of the invention with reference to the accompanying drawings.

DESCRIPTION OF THE PREFERRED EMBODIMENTS

Figure 6:
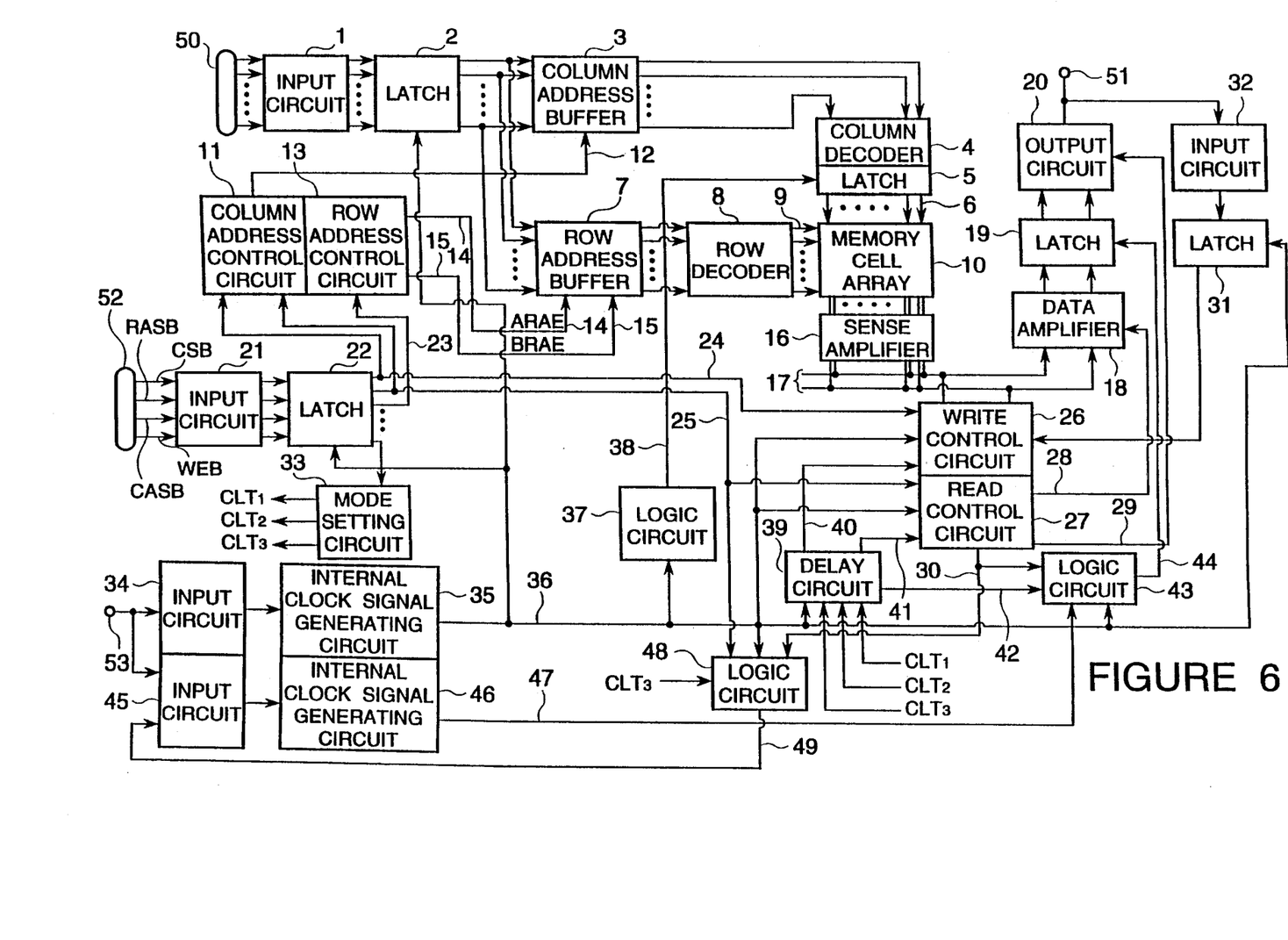
FIG. 6 is a block diagram illustrating a construction of one embodiment of the synchronized semiconductor memory device in accordance with the present invention.

Referring to FIG. 6, there is shown a block diagram illustrating a construction of one embodiment of the synchronized semiconductor memory device in accordance with the present invention. In FIG. 6, elements similar to those shown in FIG. 1 are given the same Reference Numerals, and a detailed explanation thereof will be omitted.

The shown embodiment includes an input circuit 1 for receiving an address ADD, an input circuit 21 for receiving a plurality of command signals for controlling a row address selection/reading/writing, an input circuits 34 and 45 for receiving an external clock, an output circuit 20 for outputting data, an input circuit 32 for receiving data, latch circuits 2, 5, 19, 22 and 31, a column address buffer 3, a column decoder 4, a row address buffer 7, a row decoder 8, a memory cell array 10, a column address control circuit 11, a row address control 13, a sense amplifier 16, a data amplifier 18, a writing control circuit 26, a reading control circuit 27, a mode setting circuit 33, internal clock signal generation circuits 35 and 46, logic circuits 37, 43 and 48 and a delay circuit 39.

Figure 7:
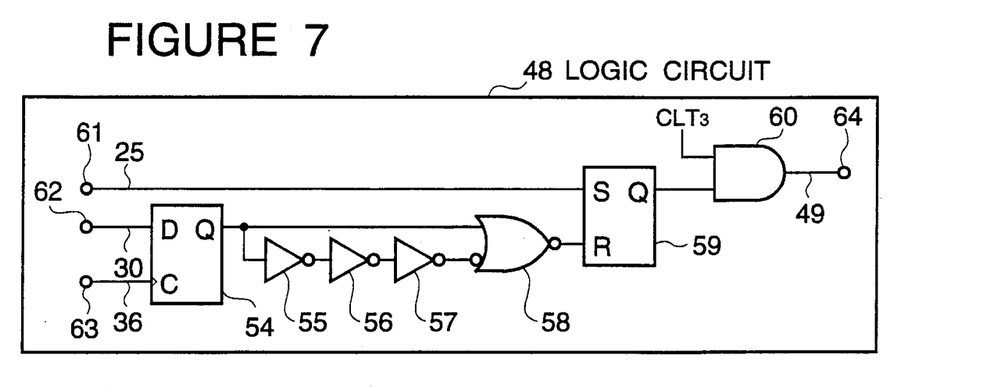
FIG. 7 is a logic circuit diagram showing a construction of the logic circuit included in the synchronized semiconductor memory device shown in FIG. 6.

FIG. 7 shows a circuit diagram of the logic circuit 48 of FIG. 6. The logic circuit 48 is composed of a flip-flop circuit 54 having a first input "D" receiving the internal clock signal (3) enable signal 30 and a second input "C" receiving the first reference internal clock signal (1) 36, three cascaded inverters 55, 56 and 57 connected in such a manner that an input of the first inverter 55 is connected to an output "Q" of the flip-flop circuit 54, a NOR circuit 58 having a first input terminal connected to the output "Q" of the first flip-flop 54 and a second input terminal connected to an output terminal of a third inverter 57, another flip-flop circuit 59 having a first input "S" receiving the reading command signal 25 outputted from the latch circuit 22 and a second input "R" connected to an output of the NOR circuit 58, and an AND circuit 60 having an input terminal concocted to the mode setting level signal CLT3 set in accordance with the given mode register cycle and an second input terminal connected to an output "Q" of the flip-flop circuit 59, an output terminal of the AND circuit being connected to a signal line 64 transmitting a power supply signal 49.

Figure 8:
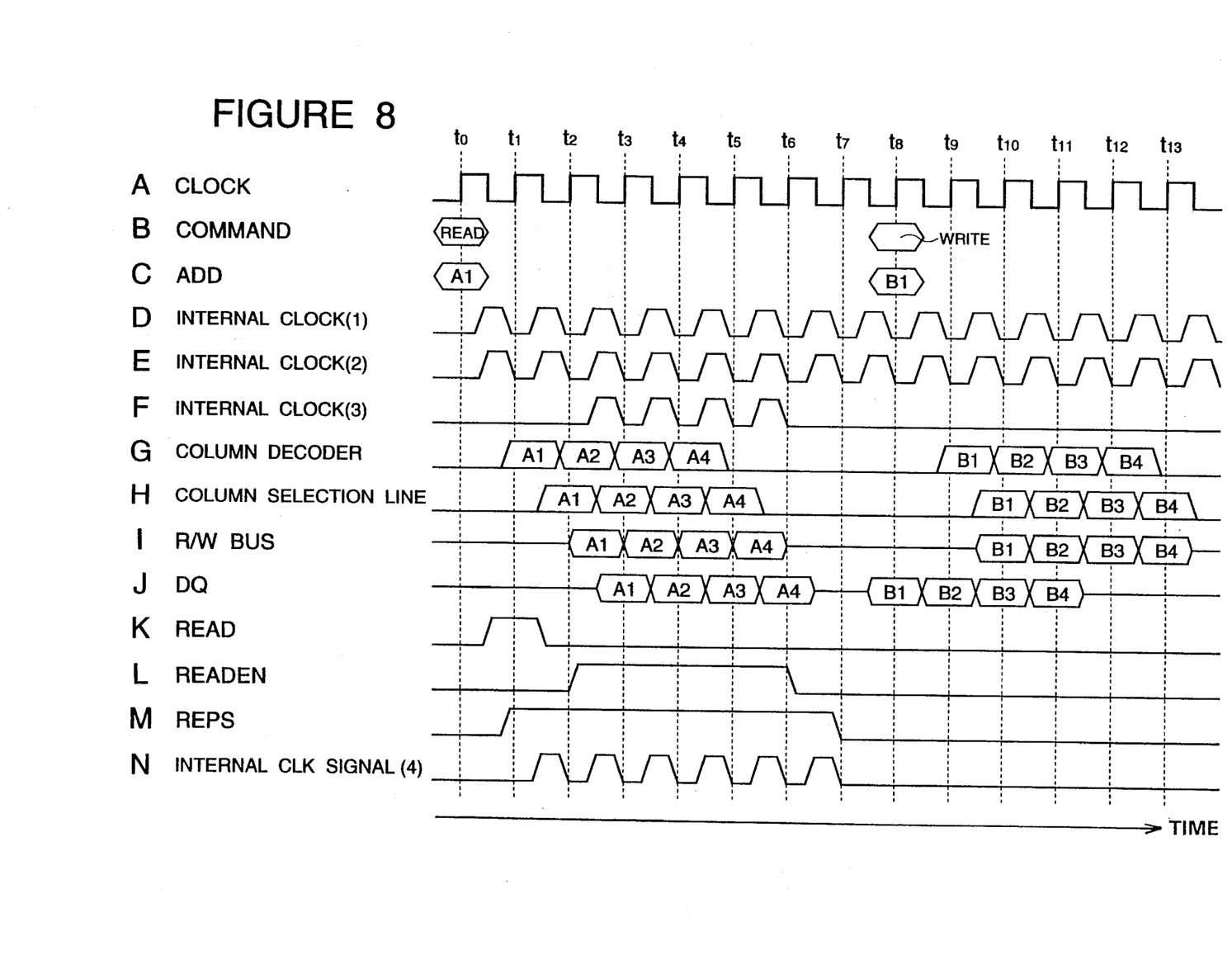
FIG. 8 is a timing chart illustrating an operation of the synchronized semiconductor memory device shown in FIG. 6.

Referring to "A" to "N" of FIG. 8, a time chart of the operation mode of "CAS LATENCY 3" of the shown embodiment is shown.

Further, as will be seen from a comparison between FIGS. 1 and 6, the shown embodiment is different from the prior art in that the input circuit 45 for receiving the external clock, the internal clock signal generating circuit 46 connected thereto, and the logic circuit 48 are newly added. As the result of the addition of the input circuit 45, the internal clock signal generating circuit 46 and the logic circuit 48, the internal clock signal (3) 44 for the latch circuit 19 in the synchronizing circuit of data output is supplied to the latch circuit 19 through the logic circuit 43 as the exclusive internal clock signal.

In the embodiment shown in FIG. 6, an operation when an ACTIVE command (row address operation command: the signals CSB and RASB are at a LOW level and the signals CASB and WEB are at a HIGH level) is applied, a data reading operation when a READ command (reading operation command: the signals CSB and CASB are at a LOW level and the signals RASB and WEB are at a HIGH level) is applied and an address ADD(A1) is applied, and a data writing operation (writing operation command: the signals CSB, CASB and WEB are at a LOW level and the signal RASB is at a HIGH level) is applied, are fundamentally the same as those in the conventional example shown in FIGS. 1 to 5. Therefore, in order to avoid a double explanation in the following, only an operation of "CAS LATENCY 3" mode which is distinctive in the present invention will be mainly explained here.

The embodiment of shown in FIG. 6 is a synchronized semiconductor memory device of a two-banks type which is the same as the prior art. In the shown embodiment, an input circuit connected to the terminal 53 from which external clock signals input is composed of two input circuits of 34 and 45, and two internal clock generating circuits of 35 and 46 are composed corresponding each to the input circuit 34 and 45. The input circuit 45 and the internal clock signal generating circuit 46 newly composed are independent, and they are the circuit to generate internal clock signal (3) 44 which is exclusive for the latch circuit 19 of data output circuit. In the mode of "CAS LATENSY 3", the internal clock signal (4) 47 outputted from the internal clock signal generating circuit 46 inputs into the latch circuit 19 through the logic circuit 43 as an exclusive internal clock signal (3) 44 for the latch circuit 19. More in the operation mode of "CAS LATENSY 2", the internal clock signal (1) 36 outputted from the internal clock signal generating circuit 35 is inputted into the latch circuit 19 through the logic circuit 43 as the internal clock signal (3) 44. In the operation mode of "CAS LATENSY 1", the internal clock signal (7) 42 outputted from the delay circuit 39 is inputted into the latch circuit 19 through the logic circuit 43 as the internal clock signal (3) 44.

Referring to FIG. 6, the logic circuit 48 is a circuit to generate and output the power supply signal 49 for the input circuit 45, the power supply signal 49 is generated by receiving READ command signal (READ) 25, enable signal (READEN) 30 of internal clock signal (3) to control whether outputs the internal clock signal (3) or not, the internal clock signal (1) 36, and a level signal sent from the mode set signal circuit 33 through the mode set line CLT 3. In the operating mode of "CAS LATENSY 3", the signal line CLT 3 of the logic circuit 48 shown in Figure becomes a HIGH level. In the operating state, READ command (READ) 25 inputted into the terminal 61, becomes a HIGH level and it outputs from the read control circuit 27. When the enable signal (READEN) 30 of the internal clock (3) inputted into the terminal 62 becomes a HIGH level, the power supply signal (REPS) 49 which outputs from the terminal 64, through the flip-flop circuit 54, the inverters 55–57, the NOR circuit 58, the flip-flop circuit 59 and the AND circuit 60, is set a HIGH level. It is inputted into the input circuit 45 and the power is supplied into the input circuit 45. As the result, by receiving the external clock signal inputted into the terminal 53, the internal clock signal (4) 47 outputted from the input circuit 45 and the internal clock signal generating circuit 46 inputs into the logic circuit 43. In the logic circuit 43, the internal clock signal (4) 47 is selected and outputted as the internal clock signal (3) 44 by the control of the enable signal (READEN) 30 of the internal clock signal (3) of a HIGH level which is inputted from the reading control circuit 27. And it outputs into the latch circuit 19. On the other hand, when the enable signal (READEN) 30 of internal clock signal (3) outputted from the reading control circuit 27 is a LOW level, the reading operation ends. As the result, at a timing of the next clock signal (1) 36, the power supply signal (REPS) 49 outputted from the logic circuit 48 is set a LOW level, and the power supply for the input circuit 45 is stop. The input circuit of synchronized semiconductor memory device is constituted with a current mirror circuit shown in FIG. 5 of a high response speed to satisfy the general operating condition of SETUP/HOLD. The current mirror circuit composes inverters 66 and 73, PMOS transistor 67,68,69 and 70, NMOS transistors 71 and 72. The input circuit is an amplifier which inputs an input from the terminal 75 and a reference level (Vref) from the terminal 75 and amplifies the difference. In a case that the input circuit is applied to the input circuit 45, the current flows constantly under the condition of a state of a HIGH level of the power supply signal.

The present invention comprises the input circuit 45 and the internal clock signal generating circuit 46 separate with the input circuit 34 and the internal clock signal generating circuit 35. The reason why the input circuit 45 and the internal clock signal generating circuit 46 are independent from the input circuit 34 and the internal clock signal generating circuit 35 is to prevent an useless augmentation of the standby current of synchronized semiconductor memory device. If the generating of the internal clock signal (4) 47 is realized by the separation of the buffer of the input circuit and the internal clock signal generating circuit, the drive power becomes insufficient, unless the separated buffer size of the former stage is great. In accordance of it, a following problem is occurred. Namely, a delay time of the internal clock signal becomes inevitably great, unless the size of current mirror circuit is not great. It is necessary for the current mirror circuit to be great to prevent the delay of time. In this case, its current becomes great and the standby current also augments. Considering to the standby current of the power down mode of synchronized semiconductor memory device, the current of the current mirror circuit connected to the terminal 53 corresponding to the external clock signal is 80% of its total current. Therefore, it is necessary to reduce the size of the current mirror circuit as possible. When the input circuit is divided into the input circuit 34 and the input circuit 45 as the present invention, the input current mirror circuit is also formed separately, and the current mirror circuit of the input circuit 45 for the internal clock signal (4) 45 supplies the power only in the mode of reading operation in "CAS LATENSCY 3". In this case, an augmentation of the standby current is not caused at all, only a reading current augments a few, but its occupation rate of all size is comparatively small. And also, the size of input circuit 34 may be formed a little smaller, because the load is divided into two parts.

Referring to the time chart shown in FIG. 8, the operation mode of "CAS LATENCY 3" of the present invention is explained.

Let it be supposed that a row selection line is selected, as same as the explanation of the prior art. At time $t_0$, READ command (READ command: CSB and CASB are a LOW level, RASB and WEB is a HIGH level) and address ADD (A1) are inputted. The READ command is decoded through the inputted circuit 21 and inputted into the latch circuit 22 (D type flip-flop circuit). And further, the external clock inputted at time $t_0$ inputs into the internal clock signal generating circuit 35 through the input circuit 34, and the internal clock signal (1) 36 is generated in it. The reading command inputted into the latch circuit 22 is latched, and is outputted as READ command and sent to the reading control circuit 26. In the reading control circuit 26, the data amp control signal 28, the output enable signal 29 and the enable signal (READEN) 30 of the internal clock 30 etc. are outputted at each own timing by receiving the READ signal (READ). The READ signal (READ) 25 is inputted also into the logic circuit 48, and it acts to set the power supply signal 49 for the input circuit 45 a HIGH level. As the result, the power is supplied to the input circuit 45, and the internal clock signal is generated in the input circuit 45 and the internal clock signal generating circuit 46 corresponding to the clock input of time t1.

The address input ADD (A1) is inputted into the latch circuit (D type flip-flop) 2 through the input circuit 1, and is latched in response to the internal clock signal (1) 36, and the address latched is inputted into the column decoder 4 through column address buffer 3. The ADD (A1) outputted from the column decoder 4 is latched in response to the internal clock signal (2) 38 outputted from the logic circuit 37 corresponding to the clock input of time t1. And the memory cell expected to be read of the memory cell array 10 is selected. Next, the data output read from the memory array cycle 10 is inputted through the sense amplifier 10 and the R/W (READ/WRITE) bus 17 into the data amplifier 18 and amplified. On the other hand, the logic circuit 43 outputs the internal clock signal (3) 44 by receiving the internal clock (4) 47 generated in the internal clock signal generate circuit 46. And the data output read from the memory cell 10 is latched in the latch circuit (D type flip-flop) 19 by the internal clock signal (3) 44 outputted from the logic circuit 43. It outputs from the terminal 51 through the output circuit 20. During the operation above mentioned, in the logic circuit 43, the internal clock signal (3) 44 corresponding to the internal clock signal (4) 47 is selected by the control of the enable signal (READEN) 30 of a HIGH level of internal clock(3) inputted from the reading controls circuit 27, and it is outputted from the logic circuit 43. And when the reading operation ends, the enable signal (READEN) of the internal clock (3) becomes a LOW level. Further, the power supply signal (REPS) 49 outputted from the logic circuit 48 becomes a LOW level, and the power supply for the input circuit 45 is stopped. Therefore, the internal clock signal (4) 47 corresponding to the clock signals after time t7 is not generated on the internal clock signal generating circuit 46. Referring to FIG. 8, the time chart shown in FIG. 8 is that of a case of burst length of 4 bit as same as FIG. 3, and in a series of its operation, the next each reading operation is executed in each 1 cycle, and each operation is processed parallel. Namely, the second bit (A2) is executed during 3 clocks of t1–t3, the third bit (A3) is executed during 3 clocks of t2–t4, the forth bit (A4) executed during 3 clocks of t3–t5. Now, as the writing operation is same with the prior art explained before, the explanation is neglected.

As mentioned above, as means which generates an exclusive internal clock for the data output for a synchronizing circuit of data output stage, the present invention has means comprising an exclusive clock input circuit to input a necessary external clock, an internal clock signal generate circuit for the generating of the external internal clock signal for the data output, a logic circuit to supply the power for the exclusive clock input circuit only in the reading operation. The each means is composed separately from the input circuit/output circuit which is used as the synchronizing circuit of the other address input, and from the internal clock signal generating circuit to supply the internal clock signal to theses input/output circuit. As the result, the present invention has effects to dissolve unusual time delay of the internal clock and to make speed up the operation speed of mode of "CAS LATENCY 3" in the synchronized semiconductor memory device and without an augmentation of standby current.

The invention has thus been shown and described with reference to the specific embodiments. However, it should be noted that the present invention is in no way limited to the details of the illustrated structures but changes and modifications may be made within the scope of the appended claims.

I claim:

1. A synchronized semiconductor memory device comprising:
   a memory cell array constituting the dynamic random access memory;
   address input means receiving an external address signal containing a row address/column address;
   address set means receiving an address information from the address input means and for generating and outputting a memory selecting signal to said memory cell array;
   command input means receiving an external command signal containing a row address selection control/reading control/writing control;
   data reading/writing control means receiving a command information from the command input means, and for controlling a data read operation and a data writing operation to the memory cell array;
   data output means controlled by the data reading/writing control means and for outputting the data read from the memory cell array;
   data input means controlled by the data reading/writing control means and for receiving the data to written into said memory cell array;
   clock input means receiving an external clock signal; and
   internal clock generating means receiving a clock information from the clock input means, and for generating a predetermined reference internal clock; and
   internal clock timing control means receiving the predetermined reference internal clock, and for generating a plurality of internal clock signals having different timings for the address input means, the address set means, the command input means, the data reading/writing control means, the data output means and the data input means;
   wherein the clock input means comprising first and the second clock input means; and wherein the internal clock generating means comprising a first internal clock generating means receiving a clock information from the first clock input means, for generating a fist reference internal clock signal controlling the address input means, the address set means, the command input means, the data reading/writing control means, the data output means and the data input means, a second internal clock generating means receiving the clock information through the second clock input means, for generating a second reference internal clock signal controlling only the data output means, and a logic circuit means receiving the first reference internal clock signal outputted from the first internal clock generate means, a specific internal clock enable signal outputted from the data reading/writing control means, a read command signal outputted from the command input means and a level signal set in accordance with a given mode register cycle, the logic circuit means generating a power supply signal for controlling the supply or no supply of power to the second clock input means.

2. A synchronized semiconductor memory device claimed in claim 1 wherein the logic circuit means includes a first flip-flop circuit having a first input receiving the specific internal clock enable signal and a second input receiving the first reference internal clock signal, three cascaded inverters connected in such a manner that an input of the first inverter of the three cascaded inverters is connected to an output of the first flip-flop circuit, a NOR circuit having a first input terminal connected to the output terminal of the first flip-flop and a second input terminal connected to an output terminal of a third inverter of the three cascaded inverters, a second flip-flop circuit having a first input terminal receiving the reading command signal outputted from the command input means and a second terminal connected to an output of the NOR circuit, and an AND circuit having an input terminal concocted to a mode setting level signal set in accordance with the given mode register cycle and an second input terminal connected to an output terminal of the second flip-flop circuit, an output terminal of the AND circuit being connected to a signal line transmitting the power supply signal.

\* \* \* \* \*